(12) United States Patent
Liu

(10) Patent No.: US 8,377,770 B2
(45) Date of Patent: Feb. 19, 2013

(54) METHOD FOR MANUFACTURING TRANSISTOR

(75) Inventor: Huanxin Liu, Shanghai (CN)

(73) Assignee: Semiconductor Manufacturing International Corp., Shanghai (CN)

( * ) Notice: Subject to any disclaimer, the term of this patent is extended or adjusted under 35 U.S.C. 154(b) by 0 days.

(21) Appl. No.: 13/305,726

(22) Filed: Nov. 28, 2011

(65) Prior Publication Data

US 2012/0214295 A1    Aug. 23, 2012

(30) Foreign Application Priority Data

Feb. 22, 2011  (CN) .......................... 2011 1 0043994

(51) Int. Cl.
*H01L 21/8238*  (2006.01)
(52) U.S. Cl. ........................................ 438/203; 438/692
(58) Field of Classification Search .................. 438/199, 438/203, 691, 692
See application file for complete search history.

(56) References Cited

U.S. PATENT DOCUMENTS

2006/0263959 A1* 11/2006 Lin et al. ...................... 438/197
2008/0286918 A1* 11/2008 Shaviv .......................... 438/211

FOREIGN PATENT DOCUMENTS

CN          101393894 A     3/2009

* cited by examiner

*Primary Examiner* — Bradley K Smith
(74) *Attorney, Agent, or Firm* — Anova Law Group, PLLC

(57) ABSTRACT

A method for manufacturing a semiconductor device includes providing a substrate having an NMOS transistor and a PMOS transistor formed thereon, forming a stressed layer that covers the transistors, and selectively removing the stressed layer on the PMOS transistor. The method further includes annealing the substrate, removing the remaining stressed layer, forming a dielectric layer structure on the transistors; and performing a first planarization process on the dielectric layer structure. The method also includes forming a corrosion-resistant insulating structure on a rear surface of the substrate, and performing a second planarization process on the dielectric layer structure. The semiconductor device thus formed can withstand high voltages while maintaining gate oxide integrity.

16 Claims, 4 Drawing Sheets

METHOD FOR MANUFACTURING TRANSISTOR

CROSS-REFERENCES TO RELATED APPLICATIONS

The present application claims the priority of Chinese Patent Application No. 201110043994.1, entitled "Method for Manufacturing Transistor", and filed on Feb. 22, 2011, the entire disclosure of which is incorporated herein by reference.

FIELD OF THE INVENTION

The present invention generally relates to the semiconductor manufacturing field, and more particularly, to a method for manufacturing a semiconductor device including transistors that can withstand high voltages while maintaining gate oxide integrity.

BACKGROUND OF THE INVENTION

The stress memorization technique (SMT) and the stressed contact etching stop layer technique (stressed-CESL) are adopted to promote carrier mobility of a transistor. Through these two techniques, a stable stress can be formed in a channel region of a transistor, which promotes carrier mobility in the channel. A direction of the stress is parallel to a length direction of the channel and the stress may be a tensile stress or a compressive stress. Generally, the tensile stress makes atoms arranged sparsely in the channel so that mobility of electrons is promoted. The tensile stress is more suitable for NMOS transistors. In contrast, the compressive stress makes atoms arranged closely in the channel so that mobility of holes is promoted. The compressive stress is more suitable for PMOS transistors.

FIG. 1 to FIG. 3 are schematic cross-sectional views of intermediate structures illustrating a method for manufacturing a transistor having a tensile stress, as known in the prior art.

Referring to FIG. 1, a substrate 10 is provided on which a NMOS transistor and a PMOS transistor are formed. An insulating structure 11 is formed between the NMOS transistor and the PMOS transistor. The NMOS transistor includes a P trap (not shown), an NMOS transistor source/drain region 12 formed in the P trap and a NMOS transistor gate structure which is located between the NMOS transistor source/drain regions 12. The gate structure includes a gate oxide layer 17 disposed on the substrate, a gate 13 disposed on gate oxide layer 17 and spacers surrounding gate oxide layer 17 and overlying sidewalls of gate 13. The PMOS transistor includes an N trap, a PMOS transistor source/drain region 14 formed in the N trap and a PMOS transistor gate structure 15.

Referring to FIG. 2, a stressed layer 16 is formed on the NMOS transistor and the PMOS transistor to cover the source/drain regions 12, 14, the gate structures and the substrate 10. The stressed layer includes silicon nitride and provides a tensile stress or a compressive stress. If the stressed layer 16 provides a tensile stress, the performance of the NMOS transistor will be improved.

Thereafter, referring to FIG. 3, a portion of the stressed layer 16 disposed on the PMOS transistor is removed by an etching process using a mask layer and a portion of stressed layer 16 disposed on the NMOS transistor is not removed. Then, an annealing process is performed on the portion of stressed layer 16 disposed on the NMOS transistor to provide a tensile stress, so that the tensile stress in NMOS transistor can promote mobility of electrons in a channel region of the NMOS transistor. After the annealing process, a wet etching process is performed to remove a portion of stressed layer 16 which is disposed on gate 13 of the NMOS transistor, the source/drain region 12 and the substrate 10. Specifically, the stressed layer 16 includes silicon nitride; and a solution used in the wet etching process includes hot phosphoric acid or hydrofluoric acid.

As is well known, MOS transistors formed by the conventional manufacturing method cannot withstand high voltages, and, in electrical testings, the gate oxide integrity (GOI) of the MOS transistors is poor.

BRIEF SUMMARY OF THE INVENTION

The present invention provides a method for manufacturing a transistor to avoid GOI problems. To solve the GOI issues, embodiments of the present invention provide a method for manufacturing a semiconductor device that contains transistors. The method includes providing a substrate, the substrate contains a plurality of NMOS and PMOS transistors formed thereon, and forming a stressed layer covering the transistors. The method further includes selectively removing the stressed layer on the PMOS transistors, annealing the substrate, and removing the remaining stressed layer on the NMOS transistors. The method further includes forming a dielectric layer structure on the transistors, and performing a first planarization process on the dielectric layer structure. The method additionally includes forming a corrosion-resistant insulating structure on a rear surface of the substrate after turning over the substrate, and performing a second planarization process on the dielectric layer structure after forming the corrosion-resistant insulating structure and anew turning over the substrate.

Compared with the prior art, the method provided by embodiments of the present invention has the following advantages: the corrosion-resistant insulating structure on a rear surface of the substrate can prevent corrosion of chemical solutions and electrical connection between all layers from a top layer to a bottom layer on the substrate when the substrate is bombarded by a plasma, so that the transistor formed by the method can withstand high voltages while maintaining good gate oxide integrity.

DETAILED DESCRIPTION OF THE INVENTION

MOS transistors formed by conventional manufacturing methods may have low withstanding voltages and induce gate oxide integrity (GOI) problems. The inventor of the present invention found the following causes for the GOI issues. When silicon nitride is deposited, a silicon nitride layer is formed on a rear surface of the substrate. But the silicon nitride layer will be removed in a subsequent wet etching process to expose the rear surface of the substrate. Moreover, a high energy plasma will be used in subsequent steps such as forming a plug, forming metal interconnect lines, etching processes, chemical vapor deposition (CVD) and physical vapor deposition (PVD). Because the rear surface of the substrate is exposed, all layers of the substrate from top to bottom are likely to be electrically connected by the high energy plasma, so that a low voltage will be obtained at a gate formed on the substrate, which causes the MOS transistors to have low voltages and GOI problems.

Figure 1:
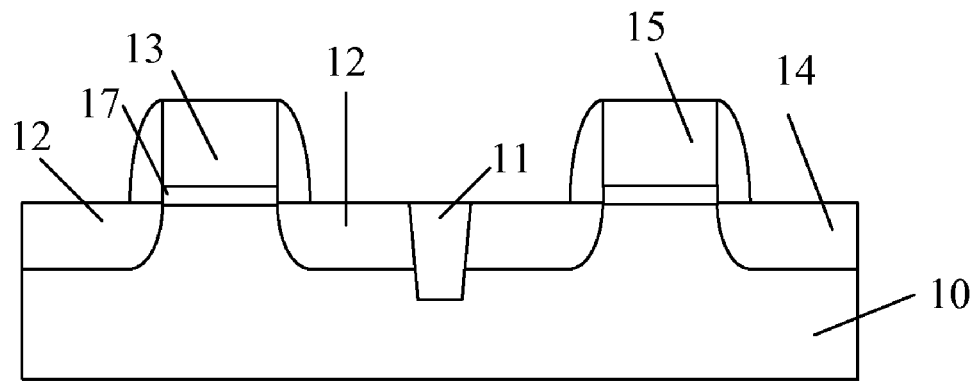
FIG. 1 to FIG. 3 are schematic cross-sectional views of intermediate structures illustrating a method for manufacturing a semiconductor device having NMOS and PMOS transistors, as known in the prior art.
Figure 2:
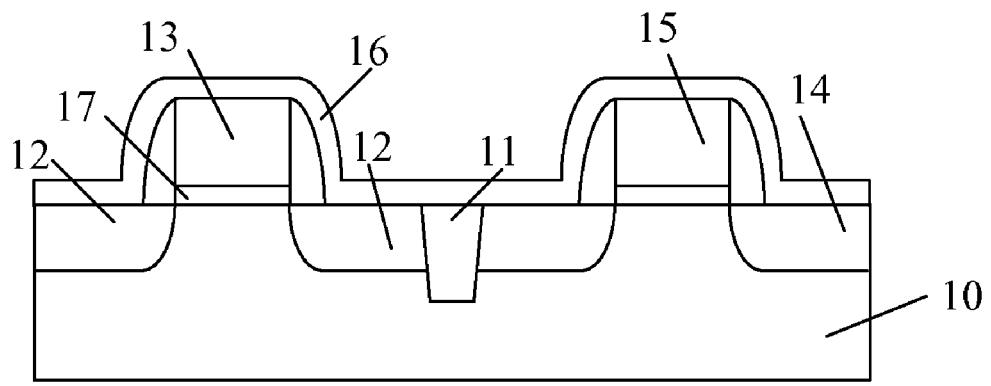
Figure 3:
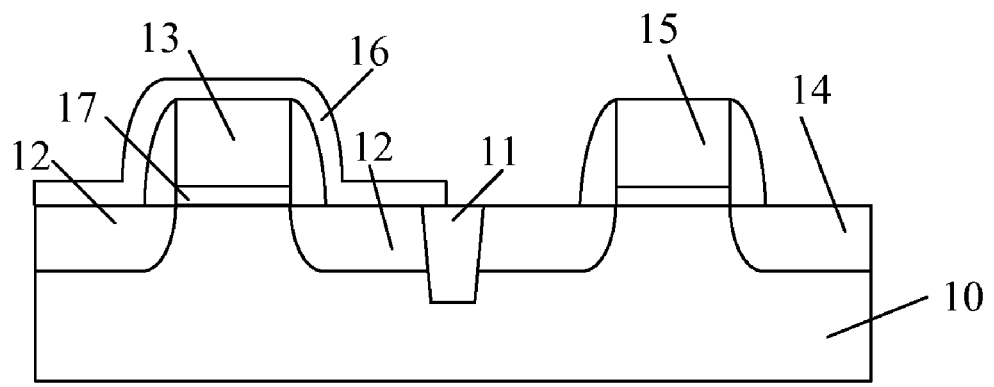
Figure 4:
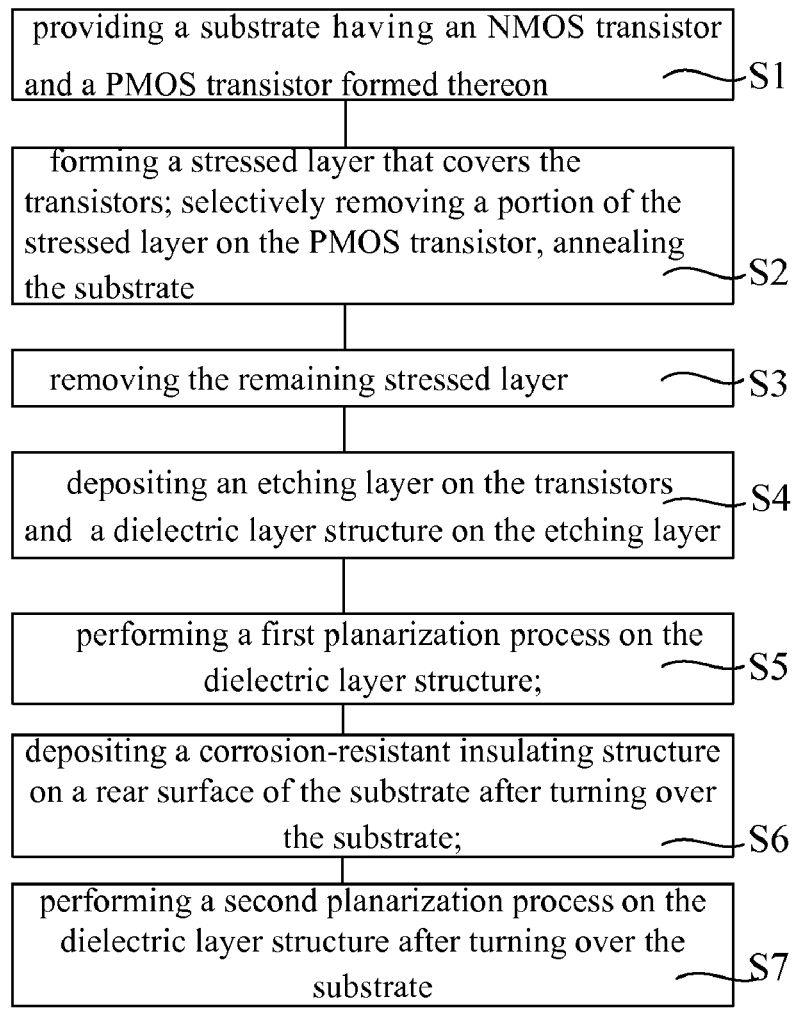
FIG. 4 is a flowchart illustrating a method for manufacturing a semiconductor device having NMOS and PMOS transistors according to an embodiment of the present invention.
Figure 5:
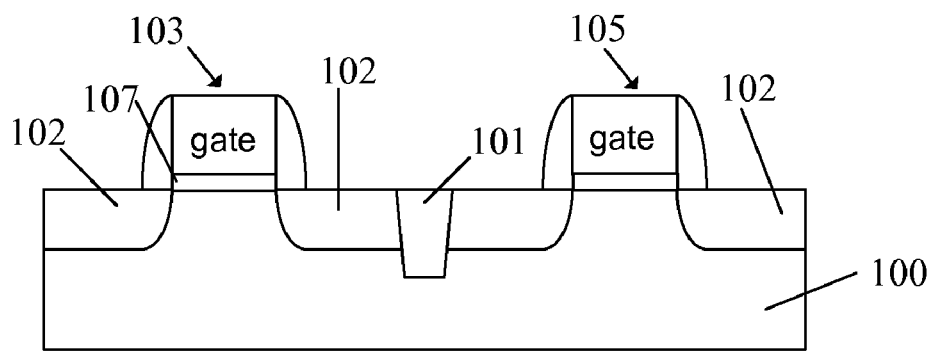
FIG. 5 to FIG. 11 are schematic cross-sectional views of intermediate structures illustrating a method for manufacturing a semiconductor device having NMOS and PMOS transistors according to an embodiment of the present invention.

Embodiments of the present invention provide a method for manufacturing a semiconductor device that includes a plurality of NMOS and PMOS transistors. Referring to FIG. 4, the method includes:

Step S1, providing a substrate having a plurality of NMOS and PMOS transistors formed thereon;

Step S2, forming a stressed layer on the transistors, selectively removing a portion of the stressed layer that covers the PMOS transistors, and annealing the substrate;

Step S3, removing the remaining stressed layer on the NMOS transistors;

Step S4, depositing an etching layer on the transistors and a dielectric layer structure on the etching layer;

Step S5, performing a first planarization process on the dielectric layer structure;

Step S6, turning over the substrate, and depositing a corrosion-resistant insulating structure on a rear surface of the substrate; and Step S7, turning over again the substrate, and performing a second planarization process on the dielectric layer structure.

Embodiments of the present invention will be described in detail below with reference to the accompanying drawings. FIG. 5 to FIG. 11 are schematic cross-sectional views of intermediate structures illustrating a method for manufacturing a transistor according to an embodiment of the present invention.

Firstly, in step S1, a substrate 100 is provided on which a plurality of transistors are formed. In an embodiment, the transistors include NMOS transistors 103 and PMOS transistors 105 (For the sake of simplicity and clarity, only one NMOS and one PMOS transistors are shown). Each MOS transistor includes a gate oxide layer 107 and a gate including poly-silicon successively formed on the substrate, spacers formed on sidewalls of the gate oxide layer 107 and the gates, and a source/drain region 102 formed on the opposing sides of the gate in the substrate. Materials and processes that are adopted to form the MOS transistors on the substrate can be the same as those adopted in the prior art and will not be described in detail herein for the sake of brevity.

In an example embodiment, the substrate 100 may include single-crystal silicon, silicon germanium, silicon on insulator (SOI), or other materials such as III-V compounds (e.g., gallium arsenide). The substrate 100 may further include an isolating structure 101 which may be a shallow trench isolation (STI) structure or a Local Oxidation of Silicon (LOCOS) structure disposed between NMOS transistor 103 and PMOS transistor 105.

Figure 6:
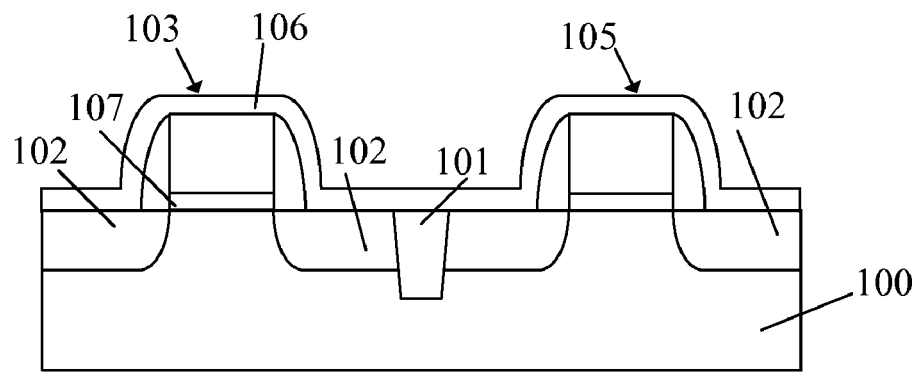

Referring to FIG. 6, in step S2, by depositing silicon nitride on the NMOS transistors 103 and the PMOS transistors 105, a stressed layer 106 is formed. It should be noted that, because the stressed layer 106 can provide a tensile stress to promote electron mobility in the NMOS transistors, a portion of the stressed layer 106 disposed on the PMOS transistors 105 is removed after the stressed layer 106 is formed, and then an annealing process is performed to ensure that the tensile stress provided by the stressed layer 106 is memorized in the gates of the NMOS transistors 103.

Moreover, the spacers of the gates include silicon nitride, and a silicon nitride layer (not shown) is also formed on a rear surface of the substrate (on which no transistor is formed) while forming the spacers.

Figure 7:
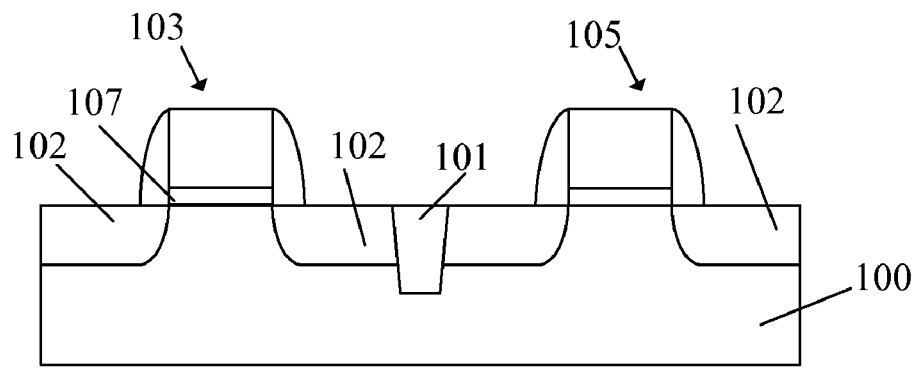

Referring to FIG. 7, in step S3, after the annealing process, a wet etching process is performed to remove the remaining stressed layer 106 disposed on NMOS transistors. In an embodiment, a solution used in the wet etching process includes hot phosphoric acid, which can remove both the stressed layer 106 and the silicon nitride on the rear surface of the substrate 100.

Figure 8:
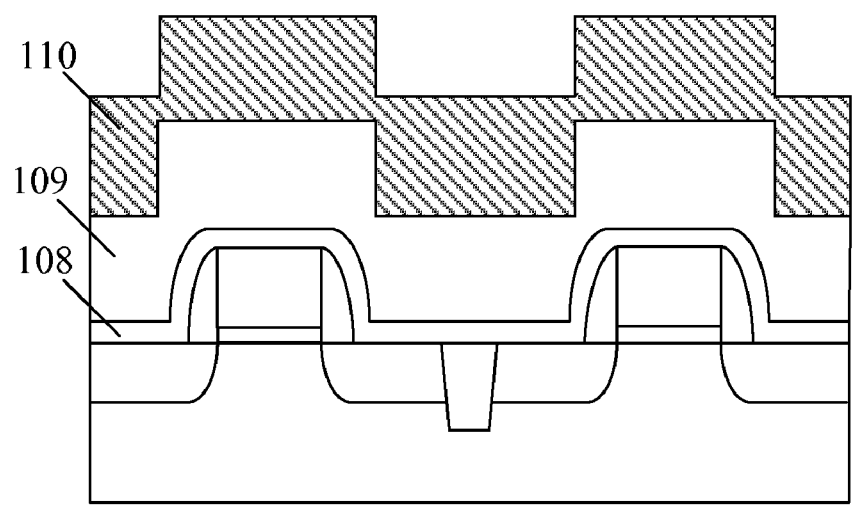

Referring to FIG. 8, in step S4, an etching stop layer 108 and a dielectric layer structure are formed successively on the NMOS transistors 103 and the PMOS transistors 105, the etching stop layer is used as a stop layer in subsequent planarization processes. In an embodiment, the dielectric layer structure includes a first silicon oxide layer 109 and a second silicon oxide layer 110 which are formed subsequently on the etching stop layer 108. The first silicon oxide layer 109 is formed by a high aspect ratio polymer process and the second silicon oxide layer 110 is formed by a TEOS process. In addition, each of the NMOS transistor and the PMOS transistor has a certain height, so that a surface of the dielectric layer structure covering the NMOS transistors and the PMOS transistors is uneven.

Figure 9:
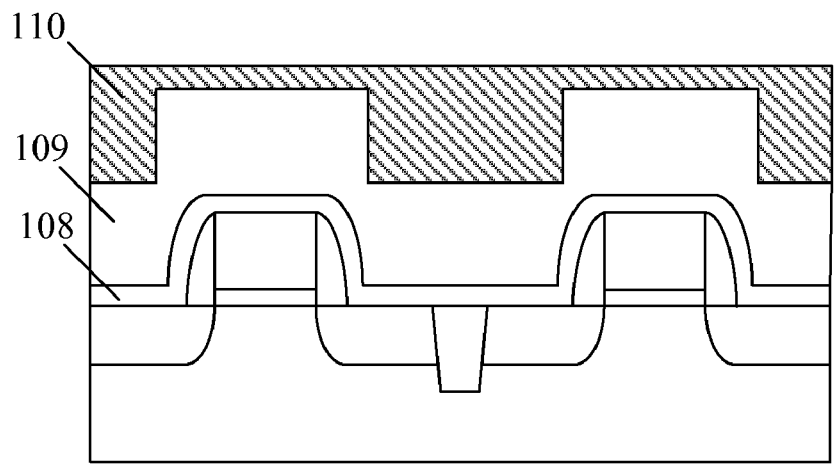

Referring to FIG. 9, in step S5, a first planarization process is performed to the dielectric layer structure to form a first planarized surface over the transistors. In other words, the gates of the transistors are not exposed by the first planarization process.

In an example embodiment, a chemical mechanical polishing (CMP) process is adopted in the first planarization process. In an embodiment, a portion of the second oxide layer is removed by the CMP process to form the first planarized surface.

It should be noted that, in an embodiment, the first planarization is only performed to the second oxide layer 110, but the scope of the present invention should not be limited by this limitation. The first planarization process is aimed to form a planarized (flat) surface. Therefore, after turning over the substrate 100, and the planarized (flat) surface with a low degree of roughness will not affect the deposition process for forming the dielectric layer structure on the rear surface of the substrate.

It should be noted that, the gates of the transistors are not exposed by the first planarization process. If the gates were exposed by the first planarization process, surfaces of the gates would be polluted. In an example embodiment, the first planarization process may be performed on the second oxide layer 110 and the first oxide layer 109, or may be performed on the second oxide layer 110 and the first oxide layer 109 and the etching stop layer 108. Those skilled in the art can choose different process conditions with appropriate selectivity ratios according to materials, which are not described in detail hereinafter.

Figure 10:
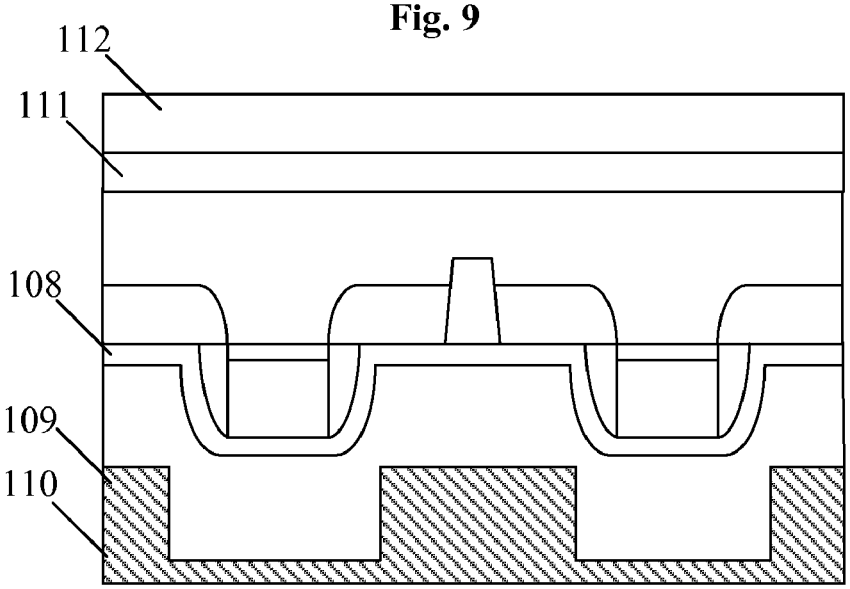

Referring to FIG. 10, in step S6, the substrate is turned over in an upside down manner so that the first planarized surface is now facing downward (the transistors are facing the bottom), and the rear surface of the substrate is facing upward and adopted as a support layer. In other words, a corrosion-resistant insulating structure is deposited on the rear surface of the substrate 100 that is facing up. In an embodiment, the corrosion-resistant insulating structure includes an insulating layer 111 disposed on the rear surface of the substrate and a corrosion-resistant layer 112 disposed on the insulating layer. Specifically, the insulating layer 111 may include $HfO_2$, the corrosion-resistant layer 112 may include nitrogen doped silicon carbide (NDC). In an embodiment, a thickness of the HfO$_2$ ranges from 20 Å to 100 Å, which can be formed by a CVD or an atomic layer deposition (ALD) process, and a thickness of the nitrogen doped silicon carbide ranges from 200 Å to 500 Å.

Moreover, HfO$_2$ is an insulating material that has a dielectric constant equal 25, and good insulating performance. Therefore, HfO$_2$ on the rear surface of the substrate 100 can prevent electrical connection between the plasma and the substrate in subsequent processes so that the transistors can withstand high voltages, and the transistors show improved gate oxide integrity in electrical performance tests.

Furthermore, nitrogen doped silicon carbide (NDC) has good corrosion resistance. Although a mixture of hydrofluoric acid and nitric acid which has certain causticity is used in two cleaning processes in subsequent steps, NDC is still corroded by hydrofluoric acid and nitric acid at a very low rate. The inventor found that the quantity of NDC which is removed is only 5 Å after performing 30 times the cleanings processes in which a mixture including hydrofluoric acid and nitric acid is used. Therefore, NDC can protect HfO$_2$ and prevent HfO$_2$ from being corroded in subsequent cleaning processes.

It should be noted that, in an example embodiment, the corrosion-resistant insulating structure includes HfO$_2$ and NDC that are successively deposited on the rear surface of the substrate 100. In an example embodiment, HfO$_2$ may be substituted by one or more materials selected from Al$_2$O$_3$, ZrO$_2$, HfO$_2$, La$_2$O$_3$, Ta$_2$O$_5$, and TiO$_2$. The materials mentioned above have dielectric constants which are greater than 10, thereby having good insulating performance while avoiding the GOI problems.

Accordingly, because NDC is corroded by hydrofluoric acid and nitric acid at a very low rate, NDC can provide excellent protection to HfO$_2$. In addition, in an embodiment, the insulating layer and the corrosion-resistant layer in the corrosion-resistant insulating structure include a single-layer structure. In an example embodiment, the insulating layer and the corrosion-resistant layer may include a single-layer structure or a multi-layer structure.

Figure 11:
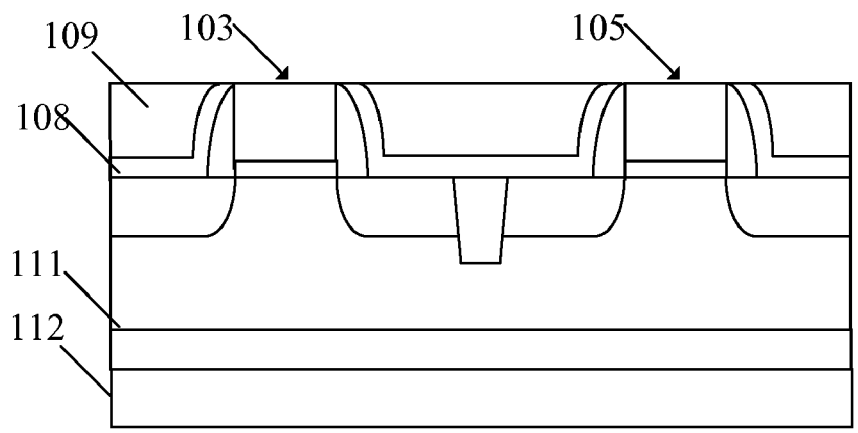

Referring to FIG. 11, in step S7, a second planarization process is performed to expose the gates of the NMOS transistors 103 and PMOS transistors 105 for preparing for a subsequent process of forming a plug. In an embodiment, and the second planarization process is a CMP process. In an embodiment, the CMP process is performed to remove the second oxide layer 110, a portion of the first oxide layer 109 disposed on the gates and the etching stop layer 108 to expose the gates for achieving a flat surface. In an example embodiment, the CMP process may be performed until a thickness of the first oxide layer 109 is at a first predetermined thickness (it should be noted that, the first thickness is a thickness of the first oxide layer 109 disposed on the etching stop layer 108). In a specific embodiment, the thickness of the first oxide layer 109 ranges from 900 Å to 1500 Å.) and the gates may not be exposed.

It should be noted that, in an embodiment, the second planarization process will be stopped when the gates are exposed, in order to prevent that an excessive portion of the gates from being removed so that the gates have an adequate height.

Furthermore, in an embodiment, the dielectric layer structure includes first oxide layer 109 and second oxide layer 110. And a first planarization process is performed on a portion of second oxide layer 110 and a second planarization process is performed on a residual portion of second oxide layer 110 and first oxide layer 109. In an example embodiment, the first planarization process may be performed on a portion of first oxide layer 109 and second oxide layer 110 and the second planarization may be performed on a residual first layer 109.

The method for forming a transistor provided by the present invention also includes forming an interlayer dielectric layer on the gates and the first oxide layer 109; patterning the interlayer dielectric layer to form a via for exposing the gates and the source/drain regions; and filling the via with electrical materials to form the plug, which is disclosed in the prior art and will not be described in detail herein.

Although the present invention has been disclosed above with reference to preferred embodiments, it is not intended to be limiting. Those skilled in the art may modify and vary the embodiments after reading the description of the present invention. Accordingly, the scope of the present invention shall be defined in the appended claims.

What is claimed is:

1. A method for manufacturing a semiconductor device, the method comprising:
providing a substrate having an NMOS transistor and a PMOS transistor formed thereon;
forming a stressed layer that covers the transistors;
selectively removing the stressed layer on the PMOS transistor;
performing an aneal on the substrate;
removing the remaining stressed layer on the NMOS transistor;
forming a dielectric layer structure on the transistors;
performing a first planarization process on the dielectric layer structure;
depositing a corrosion-resistant insulating structure on a rear surface of the substrate; and
performing a second planarization process on the dielectric layer structure.

2. The method according to claim 1, wherein the corrosion-resistant insulating structure comprises an insulating layer disposed on the rear surface of the substrate and a corrosion-resistant layer disposed on the insulating layer.

3. The method according to claim 2, wherein the insulating layer comprises a dielectric constant greater than 10.

4. The method according to claim 3, wherein the insulating layer comprises one or more materials selected from the group consisted of Al2O$_3$, ZrO$_2$, HfO$_2$, La$_2$O$_3$, Ta$_2$O$_5$, and TiO$_2$.

5. The method according to claim 2, wherein the corrosion-resistant layer comprises nitrogen doped silicon carbide.

6. The method according to claim 2, wherein the insulating layer comprises HfO$_2$ and a thickness ranging from 20 Å to 100 Å.

7. The method according to claim 5, wherein the corrosion-resistant layer comprises a thickness ranging from 200 Å to 500 Å.

8. The method according to claim 1, wherein the dielectric layer structure comprises a first silicon oxide layer on the transistors and a second silicon oxide layer on the first silicon oxide layer, and the first planarization process is performed on the second silicon oxide layer.

9. The method according to claim 1, wherein the first planarization process comprises a chemical mechanical polishing (CMP) process.

10. The method according to claim 1, wherein the second planarization process is performed until gates of the transistors are exposed.

11. The method according to claim 1, wherein the second planarization process comprises a chemical mechanical polishing (CMP) process.

12. The method according to claim 8, wherein the first silicon oxide layer comprises a thickness in the range from 900 Å to 1500 Å.

13. The method according to claim 2, wherein the insulating layer comprises a single-layer structure or a multi-layer structure.

14. The method according to claim 2, wherein the corrosion-resistant layer comprises a single-layer structure or a multi-layer structure.

15. The method according to claim 1, wherein the corrosion-resistant insulating structure is deposited after turning over the substrate, thereby the rear surface is facing upward.

16. The method according to claim 15, wherein the second planarization process is performed after depositing the corrosion-resistant insulating structure and turning over again the substrate, thereby the rear surface is facing downward.

* * * * *